United States Patent [19]
Denny

[11] Patent Number: 5,920,233
[45] Date of Patent: Jul. 6, 1999

[54] PHASE LOCKED LOOP INCLUDING A SAMPLING CIRCUIT FOR REDUCING SPURIOUS SIDE BANDS

[75] Inventor: Paul A. Denny, Cupertino, Calif.

[73] Assignee: Peregrine Semiconductor Corp., San Diego, Calif.

[21] Appl. No.: 08/751,571

[22] Filed: Nov. 18, 1996

[51] Int. Cl.[6] .................................................. H03L 7/085
[52] U.S. Cl. .............................. 331/14; 331/17; 331/25; 331/DIG. 2
[58] Field of Search .................................. 331/14, 17, 25, 331/DIG. 2

[56] References Cited

U.S. PATENT DOCUMENTS

| | | | |
|---|---|---|---|
| 3,928,813 | 12/1975 | Kingsford-Smith | 331/1 A |
| 4,206,425 | 6/1980 | Nossen | 331/1 A |
| 4,433,308 | 2/1984 | Hirata | 331/17 |
| 4,521,918 | 6/1985 | Challen | 331/17 |
| 4,682,118 | 7/1987 | Thiel | 331/17 |
| 4,929,917 | 5/1990 | Yokogawa et al. | 331/1 A |
| 5,008,629 | 4/1991 | Ohba et al. | 328/14 |
| 5,038,120 | 8/1991 | Wheatley et al. | 332/128 |
| 5,124,670 | 6/1992 | Lawton | 331/10 |
| 5,208,555 | 5/1993 | Graham et al. | 331/1 A |
| 5,247,265 | 9/1993 | Norimatsu | 331/17 |
| 5,548,249 | 8/1996 | Sumita et al. | 331/1 A |

FOREIGN PATENT DOCUMENTS 0 272 938 A2   6/1988   European Pat. Off. .

OTHER PUBLICATIONS

Roland E. Best, *Phase–Locked Loops Theory, Design and Applications,* The Classical Digital PLL (DPLL), 1993, pp. 93–104 McGraw–Hill, U.S.A.

William F. Egan, *Frequency Synthesis By Phase Lock,* "Phase Detectors", 1990, pp. 98–123, Robert E. Krieger Publishing Co., Malabar, Fl.

*Primary Examiner*—Siegfried H. Grimm
*Attorney, Agent, or Firm*—Wilson Sonsini Goodrich & Rosati

[57] ABSTRACT

An apparatus and method for reducing spurious sidebands in the tuning signal of phase locked loop frequency synthesizers and phase locked loops is disclosed. The frequency synthesizer includes an oscillator, a divider, a difference circuit and a sampling circuit. The oscillator produces a variable frequency oscillator signal in response to an applied tuning signal. The divider divides the variable frequency oscillator signal by a division factor to produce a reduced frequency signal. The difference circuit receives the reduced frequency signal to produce a difference signal corresponding to the phase difference between the reference signal and the reduced frequency signal. The sampling circuit intermittently samples the difference signal in response to a timing signal to produce a tuning signal which approaches a DC characteristic. The tuning signal serves to adjust the oscillator frequency in a direction to diminish phase differences in the reference signal and the reduced frequency signal. In another aspect of the invention, a PLL is disclosed with the sampling circuitry for intermittently sampling the difference signal in response to a timing signal.

51 Claims, 8 Drawing Sheets

PHASE LOCKED LOOP INCLUDING A SAMPLING CIRCUIT FOR REDUCING SPURIOUS SIDE BANDS

BACKGROUND OF THE INVENTION

1. Field of the Invention

The field of the invention relates generally to phase locked frequency synthesizers, and more particularly, to an apparatus and method to reduce the spurious sidebands in phase locked loops including integer and fractional phase locked loop synthesizers.

2. Description of the Related Art

Many modulation, detection, and frequency-synthesis methods, long recognized but difficult to implement, have become practical with the introduction of IC versions of the phase-locked loop (PLL). A simplified account of a PLL is a negative feedback system that maintains a constant phase and zero frequency difference between a reference frequency ($F_r$) and a variable frequency. There are many circuits commonly used as phase detectors in typical industry practice. Description of available types and their operation can be found in *Phase-Locked Loops Theory, Design and Applications,* authored by Roland E. Best, 1993, pps. 93–104 and in *Frequency Synthesis by Phase Lock,* authored by William Egan, 1990, pps. 98–123 (ISBN 0-89464-456-4), which are incorporated herein by reference. One type of phase detector is the linear mixer phase detector, in which two sinusoidal inputs are multiplied to output a sine wave whose frequency is the difference between the input frequencies. Another type is the sample and hold phase detector where a linear representation of the phase of one input signal is instantaneously sampled once per cycle of a second input. The output is maintained by a hold circuit until the next phase sample occurs. A further type is the exclusive-OR phase detector which accepts two square wave digital inputs and provides an exclusive-OR output, proportionate to the phase difference in the inputs. The most widely used phase detector in commercial IC phase-locked loops and frequency synthesizers is the phase-frequency detector. This detector has the highly desirable characteristic of providing both a phase difference signal and a frequency difference signal, which assures frequency acquisition.

Many electronic systems require an accurate frequency reference that can be programmed to one of a number of required values. For example, a FM radio must tune to 87.9 MHz, 88.1 MHz, 88.3 MHz . . . 107.7 MHz, 107.9 MHz. In this case, the radio's receiver must embody a frequency reference that can tune over a 20 MHz range with a step size of 200 KHz. This tuning function is often implemented by a phase locked loop equipped for frequency synthesis. If the PLL is configured for frequency synthesis, it will also include a programmable divider.

FIG. 1 is a simplified block diagram illustrating an example of a typical phase locked loop (PLL) implemented as a frequency synthesizer. FIG. 1 serves as only one example of a PLL and is not limited to the following described elements. The PLL synthesizer comprises a reference signal generator 102, a phase detector 106, a charge pump 108, a low pass filter 110, a voltage controlled oscillator (VCO) 112 and a programmable divider 114. The output of the phase detector is connected to the input of the charge pump. The output of the charge pump ($V_p$) provides input to the low pass filter 110. The output of the low pass filter is the tuning control voltage ($V_t$). $V_t$ is the input for VCO 112. The output of the VCO is the synthesized frequency ($F_s$). $F_s$ is the input for the programmable divider. The programmable divider reduces the frequency $F_s$ by a predetermined amount and outputs this lower frequency signal ($F_v$). $F_v$ is an input of the phase detector. The other input of the phase detector is the output $F_r$ of reference signal generator. In many frequency synthesizers the reference signal is itself derived from a signal reduced in frequency by a separate divider. A PLL implemented in this manner is known as a frequency synthesizer in that it can produce any number of output frequencies $F_s$ from a single $F_r$ depending on the value of the variable N.

FIG. 2 of the prior art illustrates a more detailed view of some of the elements shown in PLL 100 of FIG. 1. The phase detector 106 accepts as inputs $F_r$ and $F_v$ and provides as outputs an up-line 202 and down-line 204 to current sources 206A and 206B, respectively of charge pump 108. The current sources are connected to supply and ground and provide an input to VCO 112 through a connecting node $V_p$. If $F_r$ falls before $F_v$, the up-line 204 is asserted. If $F_v$ falls before $F_r$ the down-line 202 is asserted. The low pass filter 110 is implemented as a passive lag lead filter and comprises capacitors 208A–B, and a resistor 210 which are all connected to ground. Typically, the low pass filter 110 is used to integrate current before it reaches the VCO 112.

The critical node in any phase locked loop is the output node $V_p$ as shown in FIGS. 1–2. As mentioned above, node $V_p$ provides input to the VCO. Ideally, this voltage is purely DC with only error correction information present. However, in practice this goal is not easily achieved. Practical issues can introduce AC voltages, and hence unwanted FM sidebands in the synthesizer. These sidebands interfere with the ability of the PLL to keep $F_r$ and $F_v$ in phase lock. There are three primary causes for the introduction of spurious sidebands into the output of node $V_p$: charge pump leakage, current source mismatch, and sidebands resulting from the circuitry utilized in PLLs of the frequency synthesizer type.

Charge pump leakage results from the deviation from ideal performance of the components utilized in the charge pump. In charge pump 108 of FIG. 2, at least one of the current sources 206A or 206B has at least one half of the charge pump supply voltage impressed across it. As the current sources are typically constructed with nonideal transistors, this voltage causes leakage current through the transistors when the current sources should ideally be in the OFF state. This leakage current causes the capacitors 208A–B in the low pass filter 110 to charge (or discharge) during the OFF state of the charge pump. This charge is replaced periodically at each phase detector comparison cycle. The charge pump leakage causes a sawtooth waveform on node $V_p$. This introduces unwanted sidebands in the spectrum of $F_s$ thus resulting in incomplete phase lock. Ideally, a pure DC waveform is desired for node $V_p$.

The second source of unwanted sidebands in the output of $V_p$ is mismatched current sources. When the frequency and phase of $F_v$ and $F_r$ are equal, the charge pump 108 will output both up and down pulses of current, which are ideally equal and opposite, in order for the net charge injected into the low pass filter to be zero. However, because the Up and Down current sources 206A and 206B are usually constructed from complementary devices with nonsymmetrical characteristics, it is difficult to match the output current pulses rise/fall times and amplitudes. This mismatch results in transient voltage disturbances on output node $V_p$ at the comparison frequency rate, and hence unwanted sidebands in the synthesizer output spectrum and therefore incomplete phase lock.

The final source of undesirable sidebands in the output of node $V_p$ is the fractional division process associated with fractional-N frequency synthesizers. There are two types of division circuitry associated with frequency synthesis. These are called integer-N and fractional-N. In an integer-N divider, a denominator N is variable in integer steps. It follows that the smallest step change in the output frequency would be equal to $F_r$, and that tuning would only be possible at integer multiples of that $F_r$. In order to produce much smaller step changes in the output frequency, circuitry known as fractional-N has been devised. There are a number of ways to divide by fractions in fractional-N phase locked synthesizer technology. However, the methods are typically based on the principle of switching the divide ratio of the programmable VCO divider, between different values on successive comparison cycles of the phase detector. For example, a divide ratio of 100.5 could be achieved by alternately switching the programmable VCO denominator between 100 and 101. As the denominator switches output frequency, unwanted sidebands are introduced in the output spectrum of $F_s$. This can result in less than optimal tracking or signal lock, and is particularly noticeable in systems that require fine frequency resolution and high output frequencies. The sidebands introduced by the fractional division process can not be completely removed by low pass filtering and as a result, the signal phase lock is affected.

Within the limited context of reducing spurious sidebands due to the fractional division process, several conventional approaches exist. One conventional method for fractional sideband compensation is described in U.S. Pat. No. 5,038,120, entitled *Frequency Modulated Phase Locked Loop with Fractional Divider and Jitter Compensation*, issued to Wheatley et al., which is hereby incorporated by reference. This patent employs a digital accumulator to store the fractional phase error and relies on the fact that the numeric value stored in the accumulator at any time is proportional to the instantaneous systematic phase error. This method uses a digital to analog converter to generate a current that is proportional to the accumulator contents (and hence the systematic phase error). This current is then subtracted from the charge pump output of the phase detector to reduce unwanted sidebands.

Another conventional method for fractional sideband compensation is referred to as a digital spurious reduction. There have been a number of proposals concerning digital timing methods to reduce the fractional sidebands in fractional-N synthesizers. One particular method is described in U.S. Pat. No. 5,124,670, entitled *Frequency Synthesizers with Fractional Division*, issued to Lawton, which is hereby incorporated by reference. These methods use digital techniques such as, a sigma delta modulation to spread the sideband energy and increase its frequency so that the sideband can be more completely removed by the filter.

Yet another conventional method for fractional sideband compensation is referred to as phase interpolation. Phase interpolation methods recognize that the error in many architectures of fractional-N synthesizers takes a known form. These methods attempt to adjust the phase of the VCO in an open loop circuit that attempts to cancel the known phase error introduced in the division process. One form of this method is described in U.S. Pat. No. 4,206,425, entitled *Digitized Frequency Synthesizer*, issued to Nossen, which is hereby incorporated by reference.

None of the conventional methods address the elimination of spurious sidebands introduced into node $V_p$ as a result of charge pump leakage or component mismatch. Some of the above mentioned techniques do address the problem of reducing spurious sidebands resulting from fractional-N circuitry, but do so by introducing higher order sidebands.

What is needed is a PLL in which spurious sidebands at the critical node $V_p$ are reduced, and in which the degradation in tracking due to the fractional division process are substantially eliminated.

SUMMARY OF THE INVENTION

The present invention has been made in view of the above problems and an object thereof, is to provide a PLL, a PLL synthesizer and an operating method therefore, having reduced tracking error resulting from AC modulation on a node $V_t$.

A further object of this invention, is to provide a phase locked loop PLL in which the voltage obtained from the node $V_t$ approaches a DC characteristic.

In one aspect of the invention, a frequency synthesizer comprises an oscillator, a divider, a difference circuit and a sampling circuit. The oscillator produces a variable frequency oscillator signal in response to an applied tuning signal. The divider circuit has a division factor and communicates with the oscillator to receive and divide the variable frequency oscillator signal by the division factor to produce a reduced frequency signal. The difference circuit communicates with the divider circuit to receive the reduced frequency signal and produce a difference signal. The difference signal corresponds to the phase difference between the reference signal and the reduced frequency signal. The sample circuit intermittently samples the difference signal in response to a timing signal to produce a tuning signal which approaches a DC characteristic. The tuning signal serves to adjust the oscillator frequency in a direction to diminish phase differences in the reference signal and the reduced frequency output of the divider.

In another aspect of the invention the divider circuit of the frequency synthesizer, rather than communicating with the oscillator, instead receives the reference signal and produces the reduced frequency signal which is communicated to the difference circuit. The oscillator supplies the variable frequency oscillator signal to the difference circuit. The tuning signal serves to adjust the oscillator frequency in a direction to diminish phase differences in the oscillator signal and the reduced frequency signal.

In another aspect of the invention a PLL is disclosed with the sampling circuitry for intermittently sampling the difference signal in response to a timing signal. The sampling that takes place in both the frequency synthesizers and the PLL reduces spurious sidebands on the tuning signal and thereby produces a variable frequency oscillator signal having more stable characteristics.

In another aspect of the invention a difference circuit is disclosed. The difference circuit comprises, a phase comparator, an integrator, a sample circuit, and a hold circuit. The phase comparator receives a first and second signal to produce an instantaneous phase difference signal, corresponding to the instantaneous phase difference of the first and second signal. The integrator receives and integrates the instantaneous phase difference signal to produce a difference signal. The sample circuit, samples the voltage level of the difference signal in response to an applied timing signal. The hold circuit holds the sampled voltage level of the difference signal and produces a tuning signal. The tuning signal corresponds to the held voltage level of the difference signal.

In still another aspect of the invention, a method for operating a frequency synthesizer is disclosed. An oscillator signal is generated which has a frequency corresponding to an applied tuning signal. The oscillator signal is divided by a division factor which may be integer-N or fractional-N to generate a reduced frequency signal. The reduced frequency signal and a reference signal are used to generate a difference signal proportional to a phase difference between the reference signal and the reduced frequency signal. The difference signal is sampled in response to an applied timing signal to produce a tuning signal. The tuning signal produced by the sampling step has reduced AC modulation and therefore produces a stable oscillator signal.

In another aspect of the invention another method for operating a frequency synthesizer is disclosed. The reference signal is divided by a division factor which may be integer-N or fractional-N to generate a reduced frequency signal. The oscillator signal and the reduced frequency signal are used to generate a difference signal proportional to a phase difference between the oscillator signal and the reduced frequency signal. The difference signal is sampled in response to an applied timing signal to produce a tuning signal.

In another aspect of the invention a method for operating a PLL is disclosed which includes sampling the difference signal in response to an applied timing signal to produce a tuning signal. The tuning signal is used to adjust the oscillator signal The operating methods for both the frequency synthesizers and the PLL reduce spurious sidebands which degrade performance.

In another aspect of the invention a method for operating a difference circuit is disclosed. A first signal and second signal are combined to produce an instantaneous phase difference signal, such that the instantaneous phase difference signal corresponds to an instantaneous phase difference of the first and the second signal. The instantaneous phase difference signal is integrated to produce the difference signal. A voltage level of the difference signal is sampled in response to an applied timing signal. The sampled voltage level is held and output as a tuning signal.

DETAILED DESCRIPTION OF THE PREFERRED EMBODIMENTS

The present invention comprises a novel PLL and associated method of operation. The following description is presented to enable any person skilled in the art to make and use the invention. Descriptions of specific applications are provided only as examples. Various modifications to the preferred embodiment will be readily apparent to those skilled in the art, and the generic principles defined herein may be applied to other embodiments and applications, without departing from the spirit and scope of the invention. Thus, the present invention is not intended to be limited to the embodiments shown, but is to be accorded the widest scope consistent with the principles and features disclosed herein.

The present invention provides a PLL, a PLL synthesizer and operating method therefore, having reduced tracking error resulting from spurious sidebands at the output of the phase detector on node $V_p'$. The "$V_p'$" notation is used to notate the critical node voltage for the present invention. The voltage $V_p'$ is sampled rather than being continuously provided to the input of the VCO. The benefits of sampling the voltage $V_p'$ are twofold. First, spurious sidebands introduced by leakage and current source mismatch are reduced. Second spurious sidebands introduced by the fractional division process of frequency synthesis are reduced.

Figure 1:
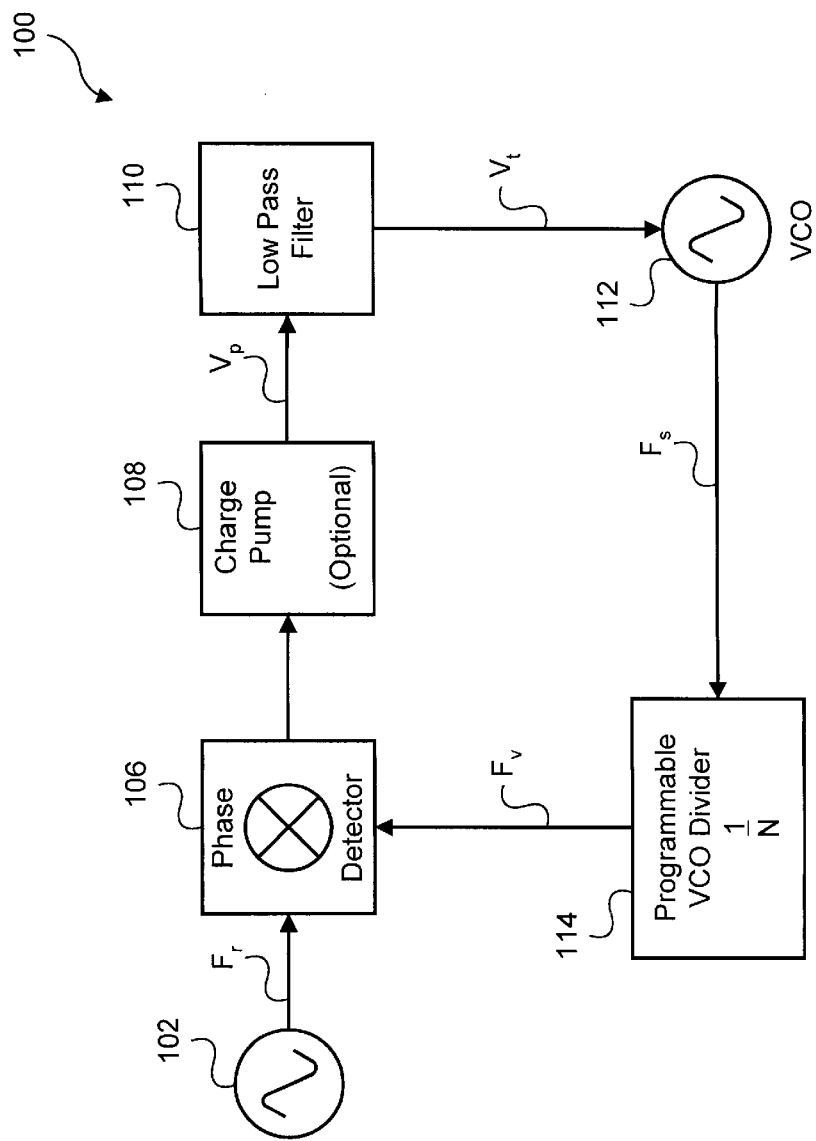
FIG. 1 is a block diagram example of a conventional phase locked loop frequency synthesizer.
Figure 2:
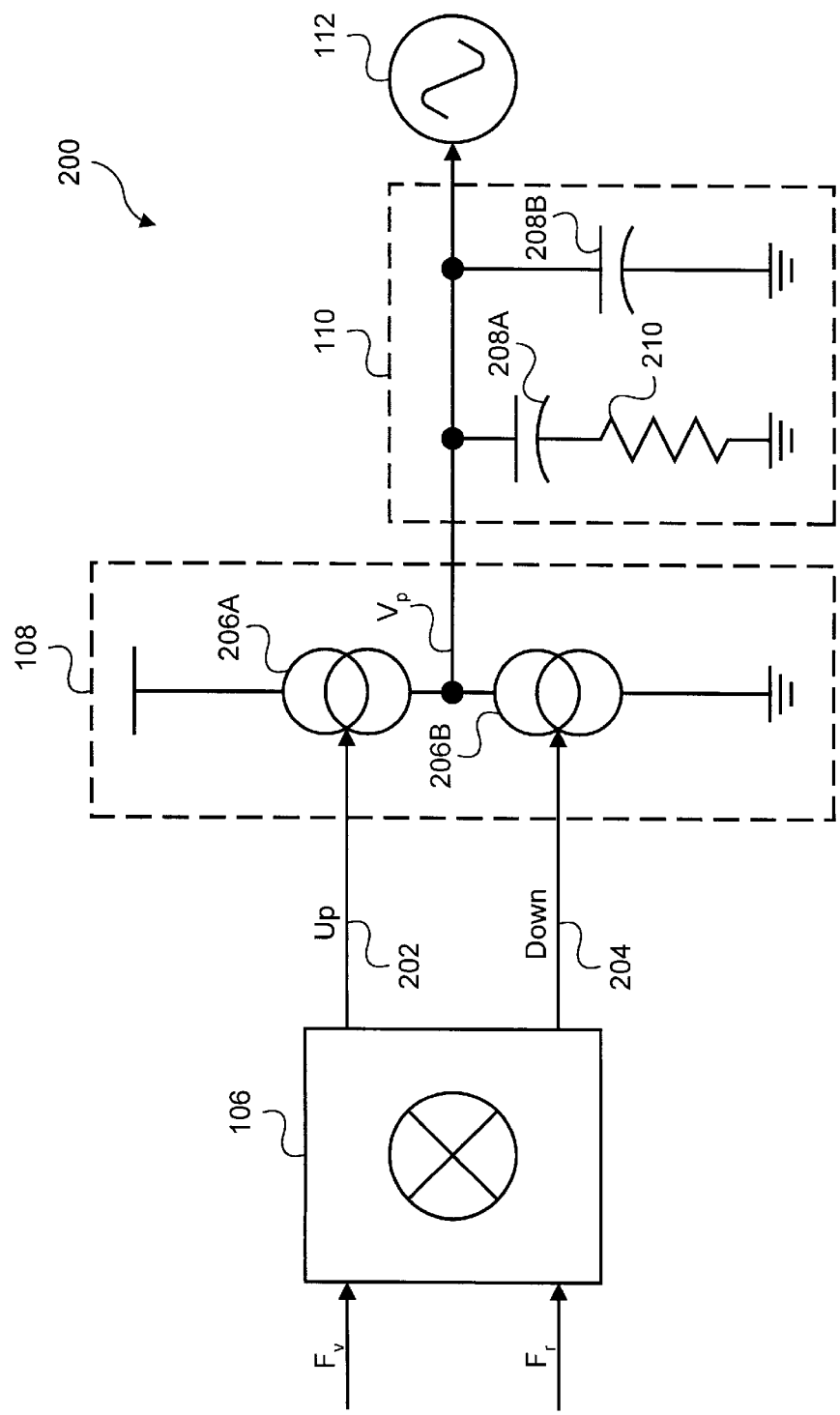
FIG. 2 is a detailed block diagram of a portion of the conventional synthesizer of FIG. 1.
Figure 3:
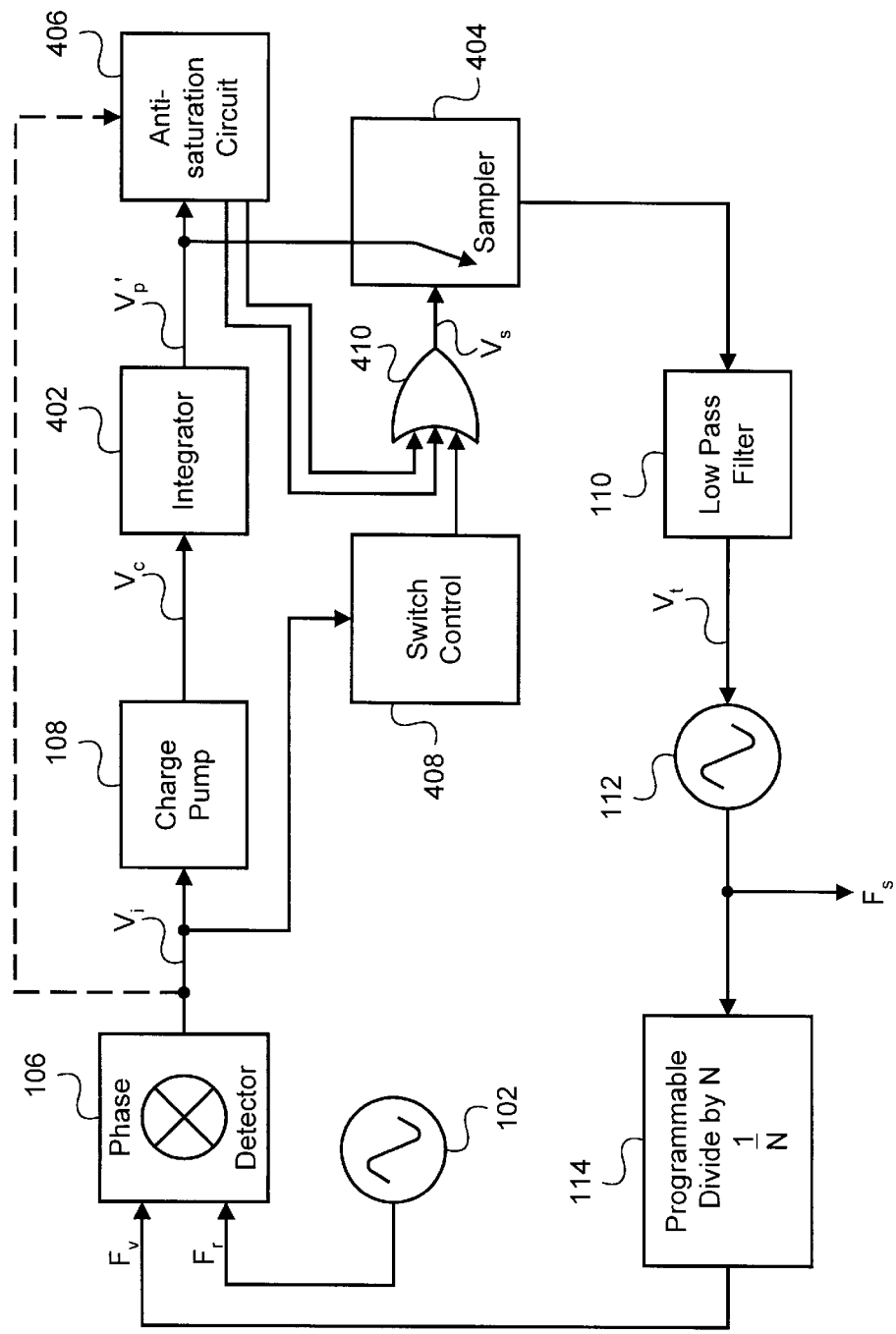
FIG. 3 is an illustrative block diagram of an integer-N phase locked frequency synthesizer in accordance with a present preferred embodiment of the invention.

FIG. 3 is an illustrative diagram of an integer-N phase locked frequency synthesizer in accordance with a presently preferred embodiment of the invention. The phase locked loop is referred to as a frequency synthesizer because it can produce any number of output frequencies $F_s$ from a single $F_r$ depending on the value of the integer variable N. The synthesizer comprises a reference frequency $F_r$ generator 102, a difference circuit, a sampling circuit, a voltage controlled oscillator 112 and a programmable divider 114. In a current embodiment, the difference circuit comprises a phase detector 106, a charge pump 108 and an integrator 402. The sampling circuit comprises a sampler 404, an anti-saturation circuit 406, a switch control 408 and OR gate 410 and low pass filter 110.

The phase detector 106 has two inputs and one output. The first input is connected to a source for a variable frequency $F_v$. The second input is connected to a reference frequency $F_r$ generator 102. The output of the phase detector is connected to the input of charge pump 108 and may additionally be connected to anti-saturation circuit 406. The output of charge pump 108 is connected to the input of integrator 402. The output of integrator 402 is connected to an input of anti-saturation circuit 406 and to sampler 404. The output of anti-saturation circuit 406 is connected to an input of OR gate 410. The other input of OR gate is connected to the output of switch control 408. The output of OR gate 410 is connected to a second input of sampler 404. The output of sampler 404 is connected to the input of low pass filter 110. The output of low pass filter 110 is connected to the input of VCO 112. The output of VCO 112 is connected to the input of programmable divider 114. The output of programmable divider 114 is connected to the first input of phase detector 106.

Figure 4:
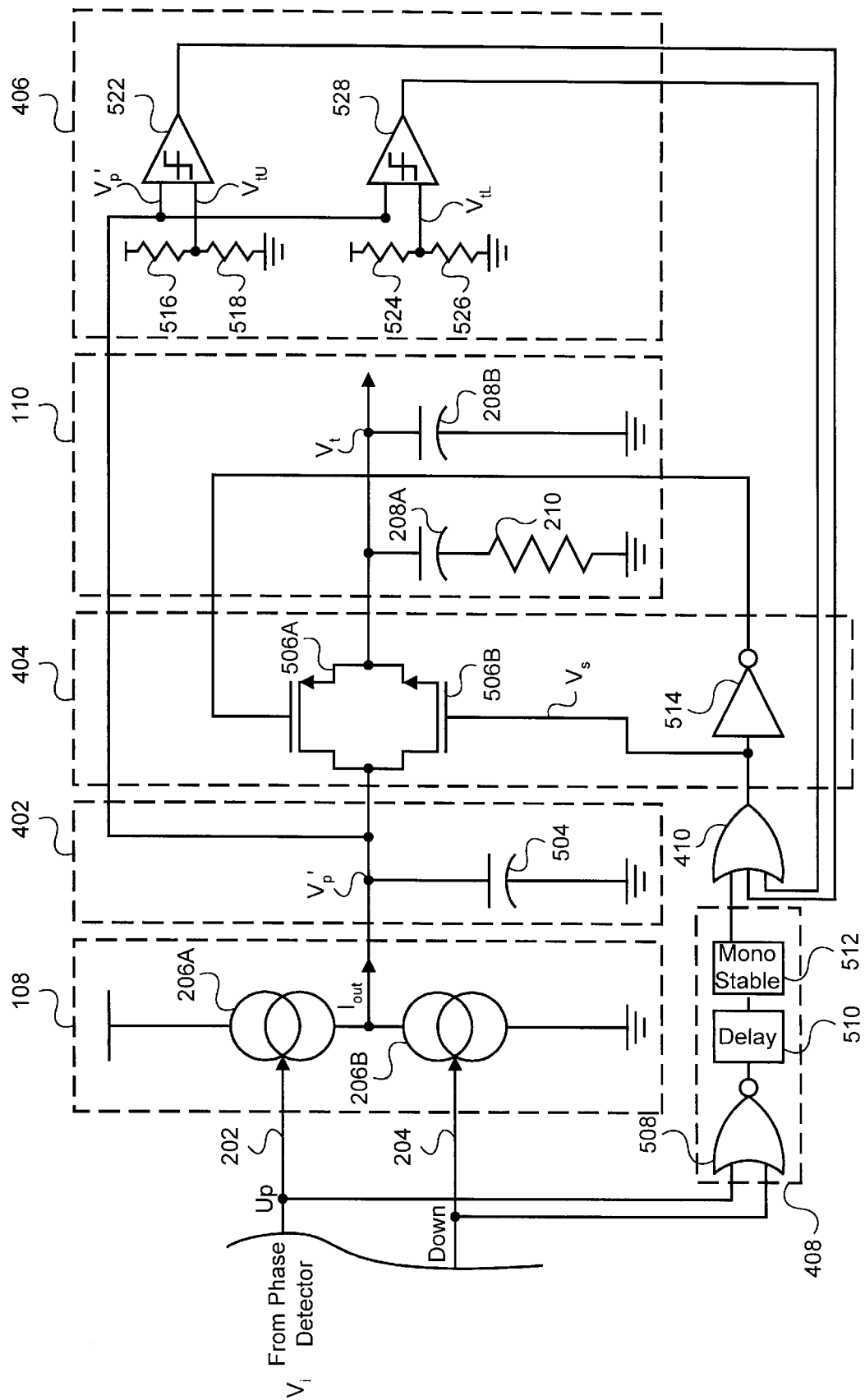
FIG. 4 is a transistor and gate level diagram of a portion of the integer-N phase locked frequency synthesizer of FIG. 3.

FIG. 4 is an illustrative transistor level and gate level diagram of the difference and sampling circuit portions of FIG. 3. Charge pump 108 comprises current sources 206A–B. Integrator 402 comprises a single capacitor 504. Sampler 404 comprises transmission gate transistors 506A–B and inverter 514. Low pass filter 110 comprises capacitors 208A–B and resistor 210. Anti-saturation circuit 406 comprises resistors 516, 518, 524, 526 and comparators 522, 528. Switch control 408 comprises NOR gate 508, delay device 510 and monostable element 512.

The output from the phase detector is shown as comprising an up-line 202 and a down-line 204. The up-line 202 is connected both to current source 206A and to an input of NOR gate 508. The down-line 204 is connected both to current source 206B and to the remaining input of NOR gate 508. Current source 206A and 206B are connected in series between a voltage supply connected to current source 206A and the ground connected to current source 206B. Capacitor 504 is connected to the common node of current sources 206A–B and to ground. Capacitor 504 is designed to have a much lower capacitance than both capacitors 208A–B of the low pass filter. Transmission gate transistors 506A–B share a common input node with capacitor 504 and the common node of the current sources. The output node of the transmission gate is connected to capacitor 208A. Capacitor 208A is in turn connected by resistor 210 to ground. One terminal of capacitor 208B is connected to ground and the other terminal is connected to capacitor 208A and to the output node of transmission gates 506A–B. Comparator 522 has an input connected to the common node of current sources 206A–B. The other input of comparator 522 is connected to a voltage reference ladder comprising supply side resistor 516 and ground side resistor 518. The output of comparator 522 is connected to an input of OR gate 410. Comparator 528 has an input connected to the common node of current sources 206A–B. The other input of comparator 528 is connected to a voltage reference ladder comprising supply side resistor 524 and ground side resistor 526. The output of comparator 528 is connected to an input of OR gate 410. The output of OR gate 410 is connected both to an input of inverter 514 and to the gate of transmission gate transistor 506B. The output of inverter 514 is connected to the gate of transmission gate 506A. The remaining input to OR gate 410 is connected to the output of monostable element 512. The input of monostable element 512 is connected to the output delay device 510. The input of delay device 510 is connected to the output of NOR gate 508.

In operation, the integer-N frequency synthesizer shown in FIGS. 3–4 provides a range of frequencies $F_s$ at the output node of VCO 112. The frequencies $F_s$ provided by this circuit are all integer-N multiples of the reference frequency $F_r$. Phase detector 106 receives a variable frequency $F_v$ from programmable divider 114, and a reference frequency $F_r$ from generator 102. A string of pulses $V_i$, corresponding to the instantaneous phase difference between $F_v$ and $F_r$ is output by the phase detector. As shown in FIG. 4, $V_i$ may be provided on separate up/down-lines. If $F_v$ falls before $F_r$ the down-line 204 will be asserted. If $F_r$ falls before $F_v$ the up-line 202 will be asserted. If up-line 202 is asserted then current source 206A will add charge to capacitor 504. If down-line 204 is asserted then current source 206B will remove charge from capacitor 504. If the input signals $F_v$ and $F_r$ are in phase, i.e., phase lock, then the voltage $V_p'$ corresponding to the charge on capacitor 504 will be constant. If the input signals $F_v$ and $F_r$ are not in phase, then $V_p'$ will change accordingly to indicate the correction required in $F_v$ to bring it back into lock with $F_r$. For example, if $F_v$ has a lower frequency than $F_r$, up-line 202 will be periodically asserted and $V_p'$ will rise. A rise in $V_p'$ will translate into an increase in the frequency of the VCO and therefore of $F_v$. Conversely, if $F_v$ is greater than $F_r$, down-line 204 will be periodically asserted and $V_p'$ will fall. The fall in $V_p'$ will translate into a decrease in the frequency of the VCO and therefore of $F_v$.

The voltage on capacitor 504 $V_p'$ would in conventional devices be continuously presented to VCO 112 via low pass filter 110. In conventional devices, every transition in $V_p'$ would result in a corresponding transition in the output frequency $F_s$ of VCO 112. An advantage of the current implementation, is that in only two circumstances is the voltage on capacitor 504 presented to VCO 112 via low pass filter 110. The first instance is when the circuit is out of lock, the second instance is at discreet sampling intervals when the circuit is in lock. The current circuit can perform as a conventional device during an out of lock condition by presenting $V_p'$ continuously to the VCO during acquisition and therefore minimizing lockup time. However, once lockup is achieved, the current implementation allows for sampling of $V_p'$ and for presenting the sampled signal to the VCO. The sampled signal is far more stable than $V_p'$ and this minimizes unnecessary modulation of $F_s$ caused by leakage, current source mismatch, or the fractional divide-by process.

When the circuit is out of lock, the output of phase detector 106 is a series of pulses on the up/down lines. The pulses are such as to always pull $F_v$ toward $F_r$. When the synthesizer is out of lock, lockup time will be reduced by shorting $V_p'$ directly to VCO 112 via low pass filter 110. Anti-saturation circuit 406 is provided to detect an out of lock condition and to short $V_p'$ to VCO 112. There are several indicators of an out of lock condition. The anti-saturation circuit 406, as shown in FIG. 4 is sensitive to the voltage level of $V_p'$. When $V_p'$ either exceeds an upper voltage threshold or is less than a lower voltage threshold, the anti-saturation circuit will enable OR gate 410, thereby closing transmission gates 506A–B, and shorting $V_p'$ to the VCO. If $F_v$ is less than $F_r$ the up-line 202 will be asserted and charge will buildup on capacitor 504. When the voltage $V_p'$ exceeds the upper voltage ($V_{tU}$) established by resistors 516–518 comparator 522 will be enabled. If $F_v$ is greater than $F_r$ the down-line 204 will be asserted and charge will be removed from capacitor 504. When the voltage $V_p'$ drops below the lower voltage $V_{tL}$ established by resistors 524–526 comparator 528 will be enabled. As $F_v$ moves in to a capture range, with respect to $F_r$, the voltage $V_p'$ is centered between $V_{tU}$ and $V_{tL}$. Under this condition, neither comparator 522 nor 528 is enabled and the transmission gates will open. The system is then placed in a sampling mode in which the voltage $V_p'$ will be intermittently sampled, and the sampled voltage will be held on the input to the VCO.

With the system in lock, capacitor 504 will be shorted to the low pass filter 110, only when neither up-line 202 nor down-line 204 is enabled. Under these circumstances NOR gate 508 will be enabled. After an appropriate interval established by delay 510, the monostable element 512 will enable OR gate 410 for a brief interval. During the enablement interval, the transmission gates 506A–B will connect capacitor 504 via low pass filter 110 to the VCO 112. The voltage level on $V_p'$ is passed to the VCO via the low pass filter. At the end of the enablement interval, switch control 408 will reopen the transmission gates. When the transmission gates are open, the capacitors 208A–B of the low pass filter hold the voltage level of $V_p'$ imparted to the low pass filter during the prior enablement interval.

In an alternate embodiment, anti-saturation circuit 406 could determine an out of lock threshold by detecting changes in the duty cycle of the up/down pulses from the phase detector $V_t$ or the charge pump $V_c$. When the PLL is in lock, the duty cycle for a phase indicating signal such as $V_i$, is typically less than 1-in-10. When the PLL is out of lock, the duty cycle is on the order of 1-in-2. The anti-saturation circuit can be constructed to detect an out of lock condition corresponding to a duty cycle of greater than 1-in-10. Once this condition has been detected, the anti-saturation circuit 406 is enabled and sampler 404 is closed to prevent saturation of capacitor 504 with the associated degradation of acquisition time.

The benefits of sampling the voltage $V_p'$ on capacitor 504 rather than continuously presenting it to VCO 112 are twofold. First, spurious sidebands introduced by leakage are reduced. The leakage path from the charge pump 108 to the low pass filter 110, is through the transmission gate transistors 506A–B of the sampler 404. These are in an open circuit condition, and thereby prevent leakage, for a substantial portion of each divide-by-N cycle. Second, spurious sidebands introduced by current source mismatch or the fractional division process itself are reduced. The AC ripple that would be introduced by current source mismatch or the fractional division process is avoided by ensuring that the transmission gates are used to sample $V_p{'}$ periodically at times when it is relatively stable and the charge pump 108 is inactive. This prevents the introduction of transient currents that could otherwise be injected into the low pass filter 110 and results in a signal $V_t$ which approaches a purely DC level.

Figure 5:
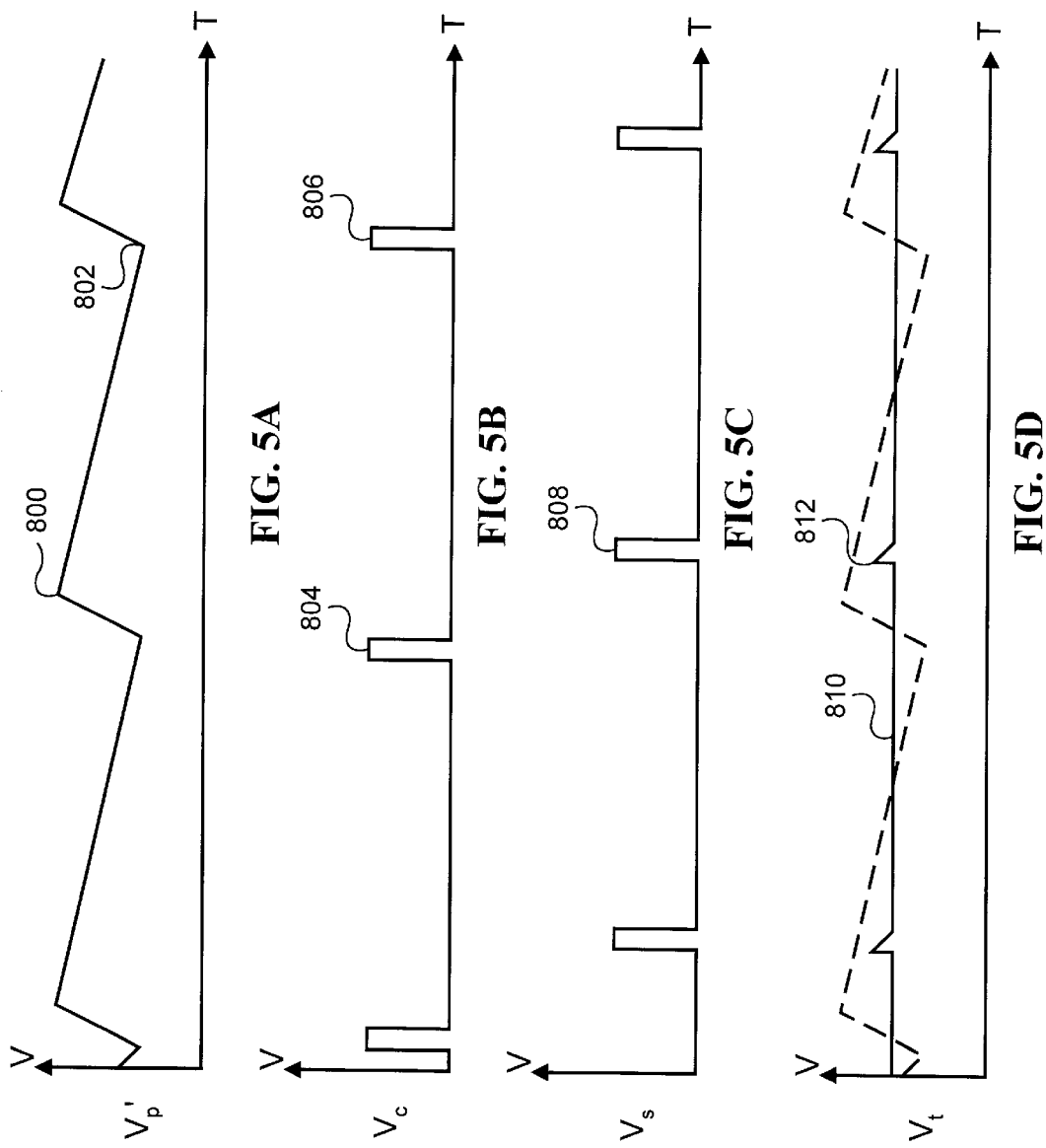
FIG. 5A–D provide illustrative drawings of waveforms for the integer-N synthesizer of FIGS. 3–4.

FIG. 5A–D shows waveforms for the integer-N synthesizer embodiment shown in FIGS. 3–4. Four waveforms are shown. FIG. 5A shows $V_p{'}$, the voltage present on the capacitor 504. FIG. 5B shows $V_c$, which represents voltage on the common node of current sources 206A–B under an open circuit condition. FIG. 5C shows $V_s$, the output of OR gate 410 during phase lock. FIG. 5D shows $V_t$, the tuning voltage present on the input of VCO 112.

$V_p{'}$ is shown with a sawtooth waveform corresponding to leakage or device mismatch in current sources 206A–B. A peak voltage 800 and a subsequent valley 802 are referenced. $V_c$ is shown with multiple voltage pulses of which 804 and 806 are referenced. Voltage pulse 804 corresponds in time to the transition from a voltage valley to the referenced peak voltage 800 on $V_p{'}$. $V_s$ is also shown with multiple voltage pulses of which 808 is referenced. The voltage pulses are uniformly delayed in time from those shown on $V_c$. Voltage pulse 808 occurs during a null period between voltage pulses 804 and 806 on $V_c$. $V_t$ is primarily DC in nature. There are long intervals of absolute DC level of which voltage 810 is referenced. This DC signal has modest ripples of which voltage 812 is referenced. The voltage level shown on $V_t$ corresponds roughly to the average voltage of the sawtooth waveform $V_p{'}$. The advantage of the current invention is that by sampling $V_p{'}$ rather than presenting directly to VCO 112, a voltage level that more closely approaches a DC value can be achieved. Because the sampler is closed once during each cycle of the integer-N divide-by process, $V_p{'}$ will be sampled at times when its voltage is constant. This eliminates unwanted modulation of the VCO and therefore of $F_s$.

In contrast to an integer-N synthesizer, in which frequency steps are integer multiples of the reference frequency, fractional-N synthesizers can produce synthesized frequencies which are fractional multiples of the reference frequency. Typically a fractional-N synthesizer cyclically changes the divide-by ratio of the programmable VCO divider between different integer values on successive comparison cycles of the phase detector. Over each complete divide-by cycle, the average frequency approaches the fractional average of the integer denominators. For example, a divide-by-N+0.5 can be produced by using an integer-N divider and dividing-by N on one cycle and N+1 on the next. On average this is equivalent to dividing by N+0.5 on both cycles.

Figure 6:
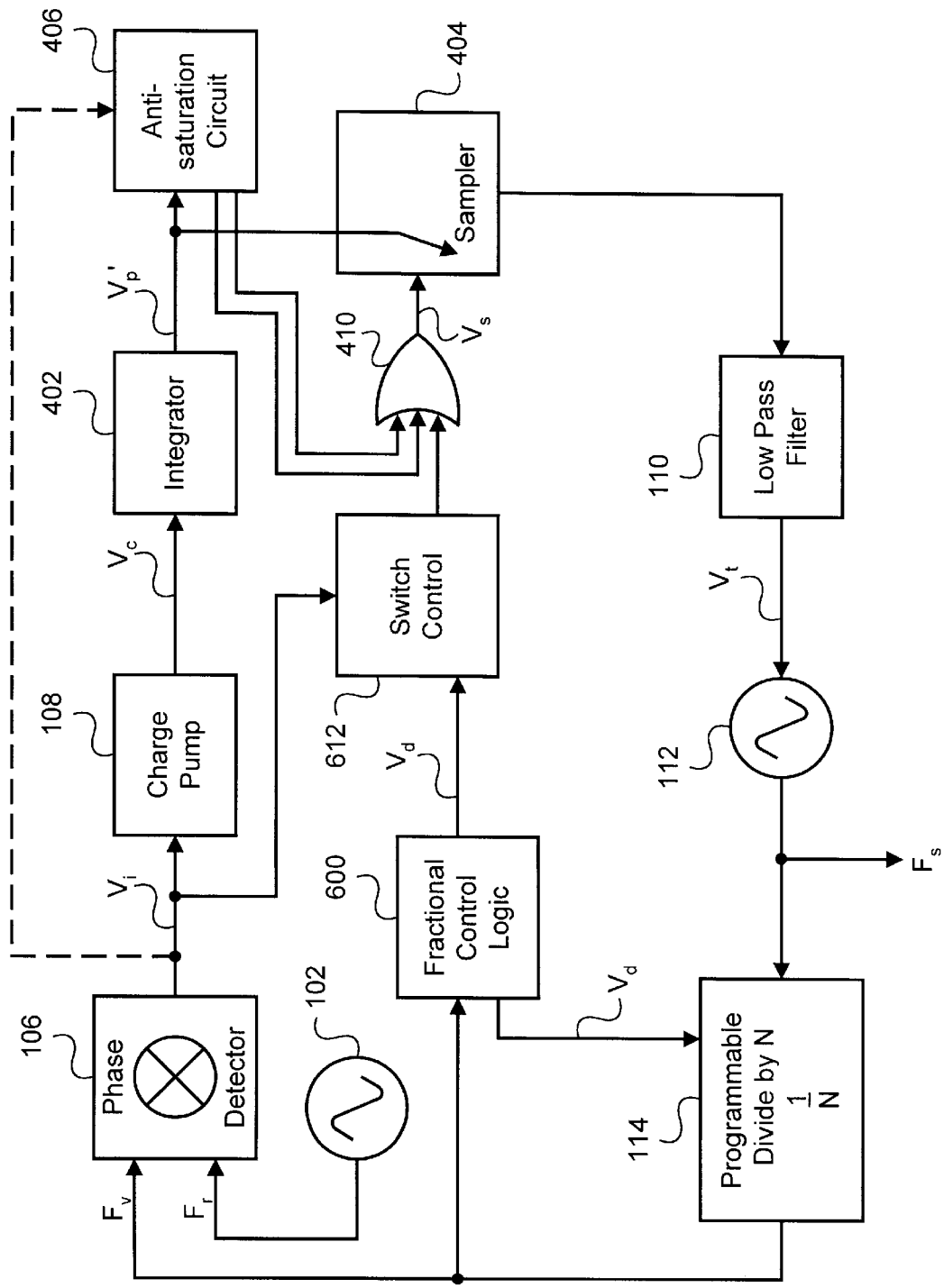
FIG. 6 is a block diagram of a fractional-N phase locked frequency synthesizer.

FIG. 6 is an illustrative block diagram of a presently preferred embodiment of a fractional-N phase locked frequency synthesizer. The circuit comprises a reference frequency generator 102, a difference circuit, a sampling circuit, a VCO 112 and a divider circuit. In the current embodiment, the difference circuit comprises a phase detector 106, a charge pump 108 and an integrator 402. The sampling circuit comprises a sampler 404 an anti-saturation circuit 406, an OR gate 410, a switch control 612 and a low pass filter 110. The divider circuit comprises a fractional control logic 600 and a programmable divider 114.

The phase detector 106 has a first input connected to the output of programmable divider 114 and a second input connected to the output of reference signal generator 102. The output of phase detector 106 is connected both to the input of charge pump 108 and to an input of switch control 612. Additionally, the output of phase detector 106 may be connected to an input of anti-saturation circuit 406. The output of charge pump 108 is connected to the input of integrator 402. The output of integrator 402 is connected both to an input of anti-saturation circuit 406 and to an input of sampler 404. The output of anti-saturation circuit 406 is connected to an input of OR gate 410. The output of OR gate 410 is connected to the control input of sampler 404. The remaining input to OR gate 410 is connected to the output of switch control 612. The output of sampler 404 is connected to the input of low pass filter 110. The output of low pass filter 110 is connected to the input of VCO 112. The output of VCO 112 is connected to the input of programmable divider 114. The output of fractional control logic 600 is connected to both an input of switch control 612 and an input of programmable divider 114. The output of programmable divider 114 is connected to both the input of fractional control logic 600 and to the phase detector 106.

In an alternative embodiment, the programmable divider 114 is instead connected between the reference signal generator 102 and the phase detector 106. The output of the programmable divider, is connected to the second input of the phase detector 106. The first input of the phase detector is connected to the output of the VCO 112. The output of fractional control logic 600 is connected to both an input of switch control 612 and an input of programmable divider 114.

Figure 7:
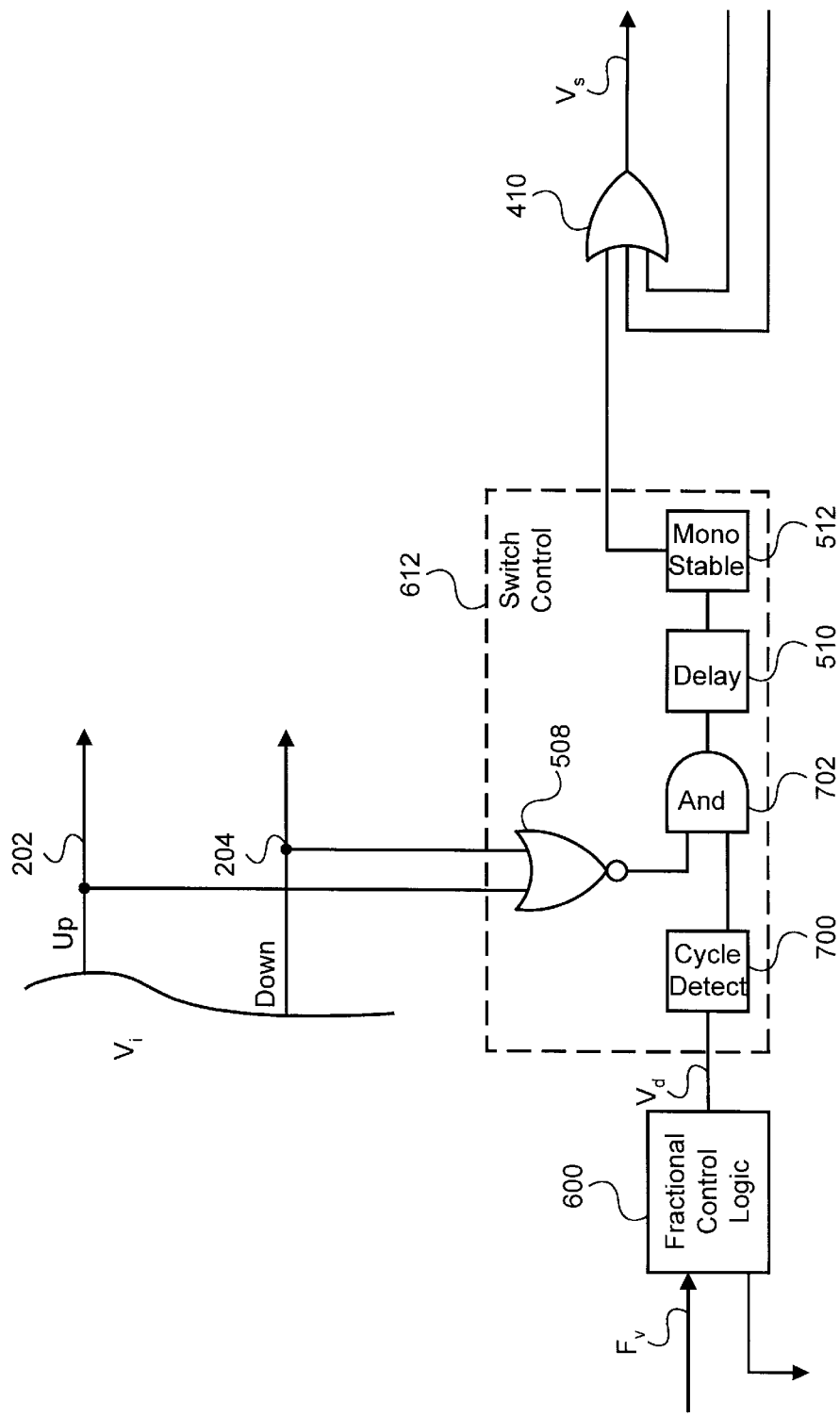
FIG. 7 is a detailed block diagram of a portion of the fractional-N phase locked frequency synthesizer of FIG. 6.

FIG. 7 is an illustrative drawing, partially at gate level and partially at a block diagram level of switch control 612 of FIG. 6. Switch control 612 comprises a cycle detect 700, an AND gate 702, a delay 510 and a monostable element 512. The input of cycle detect 700 is connected to the output of fractional control logic 600. The output of cycle detect 700 is connected to an input of AND gate 702. The inputs of NOR gate 508 are the same as those discussed above in connection with FIG. 4 connected to the up-line 202 and down-line 204 of phase detector 106. The output of NOR gate 508 is connected to the remaining input of AND gate 702. The output of AND gate 702 is connected to the input of delay 510. The output of delay 510 is connected to the input of monostable element 512. The output of monostable element 512 is as discussed above in connection with FIG. 4 connected to an input of OR gate 410.

In operation, the switch control 612 requires that both a null condition exist on the output of phase detector 106 and that a new cycle be initiated by fractional control logic 600. When both these conditions are detected AND gate 702 will be enabled. After an appropriate interval corresponding to delay 510, monostable element 512 will be triggered for a brief interval of time thereby enabling the output of OR gate 410. In connection with FIGS. 3–4, the enabled OR gate output condition shorts capacitor 504 to VCO 112 via low pass filter 110. When the switch is not enabled the capacitors 208A–B hold the charge imparted during the prior enablement.

In an alternate embodiment, the switch control 612 would have logic that responded only to a new cycle being initiated by fractional control logic 600. In this embodiment OR gate 410 would be enabled at an appropriate delay after a new cycle was initiated by the fractional control logic.

Figure 8A:
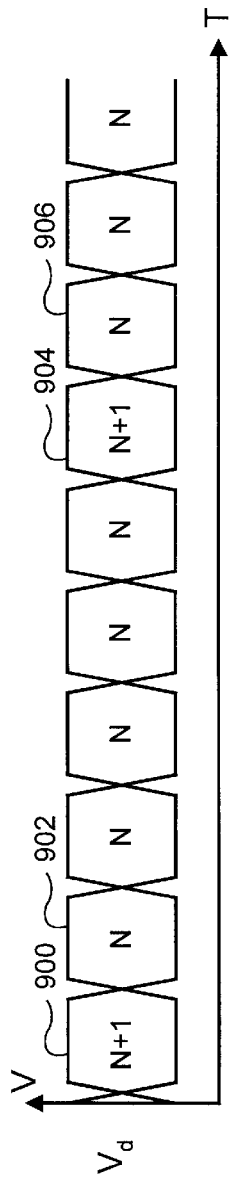
FIG. 8A–D provide illustrative drawings of waveforms for the fractional-N synthesizer of FIGS. 6–7.
Figure 8B:
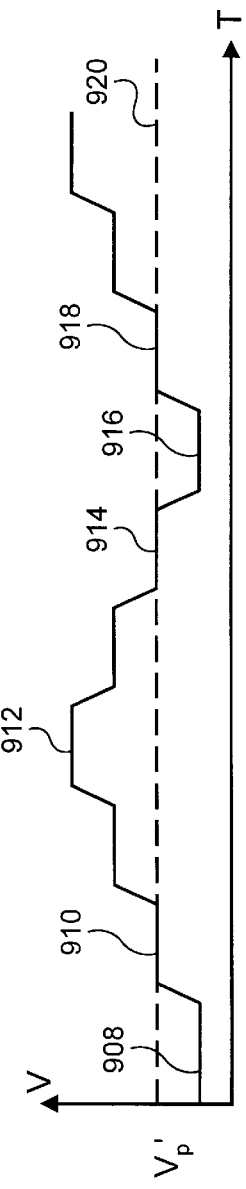
Figure 8C:
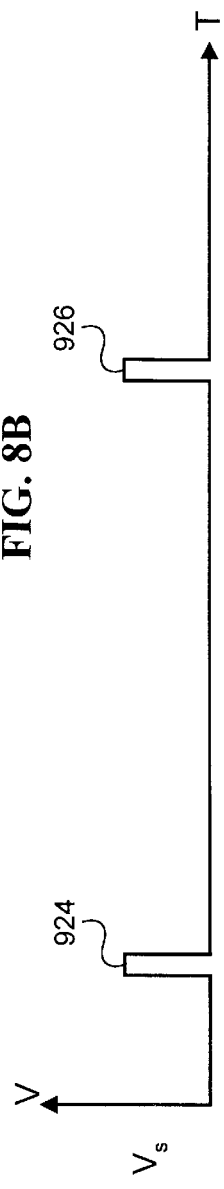
Figure 8D:
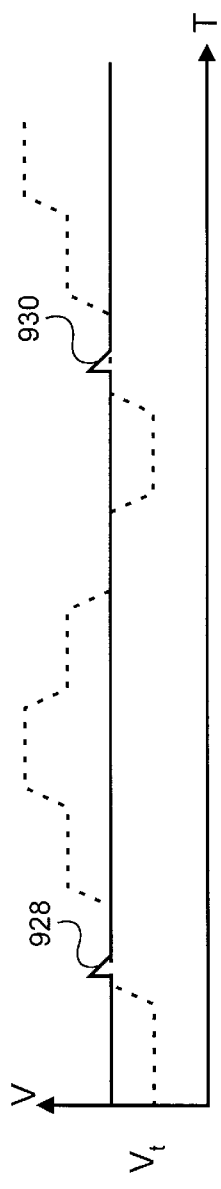

FIG. 8A–D exhibits waveforms for the fractional-N synthesizer embodiment of FIGS. 6–7. FIG. 8A shows $V_d$, the output of fractional control logic 600. $V_d$ is an input for both switch control 612 and programmable divider 114. FIG. 8B shows $V_p'$, the voltage present on capacitor 504. FIG. 8C shows $V_s$, the output of OR gate 410. FIG. 8D shows $V_t$, the tuning voltage applied to VCO 112. The waveform $V_d$ is typical of conventional fractional control logic output. In this example, the integer denominator N+1 is presented to the programmable divider once in every six cycles. By dividing the VCO output in this cyclic fashion the value for $F_s$ is produced which is a fractional multiple of $F_r$. If for example N=10, then in the example shown $F_s=10.17 \times F_r$. Depending on the periodicity of $V_d$ and the value of N a range of fractional values for $F_s$ can be obtained. The techniques for achieving this fractional control are well known to those skilled in the art and are discussed in connection with the above-mentioned patents which have been incorporated by reference.

As is shown on $V_p'$, the fractional-N process produces multiple abrupt changes in $V_p'$. The example begins with an N+1 signal 900 present on $V_d$. This corresponds to an abrupt reduction in the output frequency $F_v$ of programmable divider 114. The reduction in frequency of $F_v$ corresponding to an increase in the denominator applied by the programmable divider to $F_s$ from N to N+1. In response $V_p'$ which had been at a low voltage level 908 increases abruptly to an intermediate voltage 910. The increase in voltage level $V_p'$ corresponds to the first indication from the phase detector 106 that the frequency of the VCO 112 needs to be increased to bring $F_v$ back into phase with $F_r$. However, at the same time that $V_p'$ rises, the fractional control logic 600 has altered $V_d$ to a divide-by-N signal 902 thereby immediately increasing the output frequency $F_v$ of the programmable divider 114. As a result of these complimentary indications, the circuit initially over responds and $V_p'$ transitions to a high voltage 912. As successive divide-by-N cycles are presented by the fractional control logic 600, the circuit corrects for the over response and the voltage $V_p'$ decreases to an intermediate voltage 914 and to a low voltage 916. No sooner has low voltage 916 occurred, than a divide-by-N+1 signal 904 is again present on $V_d$. The divide-by-N+1 corresponds to an abrupt slow down in $F_v$ which causes a subsequent rise in $V_p'$ to intermediate voltage 918. The divide-by cycle repeats itself with the signal on $V_d$ then transitioning to a divide-by-N signal 906.

In the conventional fractional-N synthesizers, $V_p'$ would be presented continuously to the VCO and as a result, the VCO output $F_s$ would wander through frequency regimes represented by the different voltage levels present on $V_p'$. This would tend to degrade the accuracy of the fractional-N synthesis because $F_s$ would vary also. A teaching of the current invention is that it is preferable, when the circuit is in lock, to sample $V_p'$ once per cycle, and thereby present a uniform DC voltage $V_t$ to the VCO. This avoids unnecessary modulation of $F_s$.

As is shown in FIG. 8C, $V_s$ has two voltage pulses 924 and 926 occurring at a time identical to the occurrence of intermediate voltages 910 and 918 on $V_p'$. Intermediate voltages 910 and 918 are the voltages which need to be applied to the VCO to keep it at the fractional frequency $F_s=10.17 \times F_r$. Voltages 908, 912, 916 will produce VCO frequencies which are above or below the desired fractional relationship. As shown in FIG. 8D, $V_t$ is primarily a DC waveform with only two minor voltage ripples 928 and 930. The voltage level of $V_t$ corresponds to the voltages on $V_p'$ which are sampled and held, and of which 910 and 918 are referenced in FIG. 8B.

As described above, according to the apparatus and method to reduce the spurious sidebands in phase locked loops of this invention, the effect of spurious sidebands at the critical node can be reduced to provide improved tracking capability in PLLs and PLL synthesizers of either the integer-N or fractional-N type.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A frequency synthesizer, comprising:
   an oscillator for producing a variable frequency oscillator signal in response to a tuning signal;
   a divider circuit which divides by a division factor and communicating with said oscillator to receive and divide said variable frequency oscillator signal by said division factor to produce a reduced frequency signal;
   a difference circuit to receive a reference signal and said reduced frequency signal and to produce a difference signal corresponding to an accumulation of phase differences of the reference signal and the reduced frequency signal; and
   a sample circuit which samples the difference signal in response to a timing signal, and the timing signal repeatedly generated during a continuous accumulation of the phase differences to produce the tuning signal.

2. The frequency synthesizer of claim 1, wherein said difference circuit further comprises:
   a phase comparator to receive the reference signal and the reduced frequency signal to produce a phase signal corresponding to phase differences of the reference signal and the reduced frequency signal; and
   an integrator to receive and cumulatively integrate the phase signal to produce the difference signal.

3. The frequency synthesizer of claim 2, wherein said sample circuit further comprises:
   a null detect circuit to receive the phase signal, to detect a null in the phase signal and to produce the timing signal.

4. The frequency synthesizer of claim 1, wherein said sample circuit further comprises:
   an antisaturation circuit to receive the difference signal, to detect a threshold condition on the difference signal, and to produce a lock signal; and wherein
   said sample circuit samples the difference signal in response to at least one of the timing signal and the lock signal to produce the tuning signal.

5. The frequency synthesizer of claim 1, wherein:
   said divider circuit further comprises;
   a) a fractional control to provide a cycle signal corresponding to a changeover between at least two division factors;
   b) a fractional divider to divide the variable frequency oscillator signal by each of the at least two division factors in response to the cycle signal to produce the reduced frequency signal which is a non-integer fraction of the oscillator signal.

6. A phase locked loop, comprising:

an oscillator for producing a variable frequency oscillator signal in response to a tuning signal;

a difference circuit to receive a reference signal and said variable frequency oscillator signal and to produce a difference signal corresponding to an accumulation of phase differences of the reference signal and the variable frequency oscillator signal; and a sample circuit which samples the difference signal in response to a timing signal, and the timing signal repeatedly generated during a continuous accumulation of the phase differences to produce the tuning signal.

7. The phase locked loop of claim 6, wherein said difference circuit further comprises:

a phase comparator to receive the reference signal and the variable frequency oscillator signal to produce a phase signal corresponding to phase differences of the reference signal and the variable frequency oscillator signal; and an integrator to receive and cumulatively integrate the phase signal to produce the difference signal.

8. The phase locked loop of claim 7, wherein said sample circuit further comprises:

a null detect circuit to receive the phase signal, to detect a null in the phase signal and to produce the timing signal.

9. The phase locked loop of claim 6, wherein said sample circuit further comprises:

an antisaturation circuit to receive the difference signal, to detect a threshold condition on said difference signal, and to produce a lock signal; and said sample circuit samples the difference signal in response to at least one of the timing signal and the lock signal to produce the tuning signal.

10. A frequency synthesizer, comprising:

an oscillator comprising an input lead and an output lead, responsive to a tuning signal on said input lead to vary the frequency of an oscillator signal at the output lead;

a divider comprising an input lead coupled to the output lead of the oscillator and an output lead, responsive to the oscillator signal at the divider input lead to generate a reduced frequency signal at the divider output lead;

a difference circuit comprising a first input lead coupled to the output lead of the divider, a second input lead and an output lead, and said difference circuit responsive to the reduced frequency signal on the difference circuit first input lead and a reference signal on the difference circuit second input lead to generate a difference signal at the difference circuit output lead, and the difference signal corresponding to an accumulation of phase differences of the reference signal and the reduced frequency signal; and a sample circuit comprising a first input lead coupled to the output lead of the difference circuit, an output lead coupled to the input lead of the oscillator, and a second input lead responsive to a timing signal repeatedly generated during a continuous accumulation of the phase differences to sample the difference signal on the first input lead of the sample circuit and generate the tuning signal on the sample circuit output lead.

11. The frequency synthesizer of claim 10, wherein:

said difference circuit further comprises:

a) a phase comparator comprising first and second input leads coupled to the first and second input leads of the difference circuit and an output lead, and responsive to the reduced frequency signal on the difference circuit first input lead and the reference signal on the difference circuit second input lead to generate a phase signal at said phase comparator output lead, such that the phase signal corresponds to a cumulation of phase differences of the reference signal and the reduced frequency signal; and b) an integrator comprising an input lead coupled to the output lead of the phase comparator and an output lead coupled to the output lead of the difference circuit and responsive to the phase signal at the integrator input lead to cumulatively integrate the phase signal and to generate the difference signal at the difference circuit output lead.

12. The frequency synthesizer of claim 11, wherein said sample circuit further comprises:

a) a null detect circuit comprising an input lead coupled to said output lead of said phase comparator and an output lead, responsive to a null in the phase signal on the null detect circuit input lead to generate the timing signal at the output lead of the null detect circuit.

13. The frequency synthesizer of claim 10, wherein said sample circuit further comprises:

an antisaturation circuit comprising an input lead coupled to the first input lead of the sample circuit and an output lead coupled to the second input lead of the sample circuit, and responsive to a threshold condition on the difference signal on the input of the antisaturation circuit to generate a lock signal on the output of the antisaturation circuit; and the sample circuit is further responsive to at least one of the timing signal and the lock signal on the sample circuit second input lead, to sample the difference signal on the first input lead of the sample circuit and generate the tuning signal on the sample circuit output lead.

14. The frequency synthesizer of claim 11, wherein:

said divider further comprises;

a) a fractional divider comprising, a first input lead coupled to the input lead of the divider, an output lead coupled to the output lead of the divider and a second input lead, responsive to the oscillator signal at the first input lead and a cyclic signal at the second input lead of the fractional divider to divide the oscillator signal by each of at least two division factors to generate the reduced frequency signal at the divider output lead; and b) a fractional control logic comprising an input lead coupled to the output lead of the divider and an output lead coupled to the second input lead of the fractional divider, responsive to the reduced frequency signal at the fractional control logic input lead to produce the cyclic signal at the fractional control logic output lead, whereby said reduced frequency signal is a non-integer fraction of said oscillator signal; and the sample circuit further comprises;

a) a switch circuit comprising an output lead coupled to said second input lead of said sample circuit and an input lead, and responsive to the cyclic signal and the phase signal on the switch circuit input lead to generate the timing signal at the output lead of the switch circuit.

15. A phase locked loop, comprising:

an oscillator comprising an input lead and an output lead, responsive to a tuning signal on said input lead to vary the frequency of an oscillator signal at the output lead;

a difference circuit comprising a first input lead coupled to the output lead of the oscillator, a second input lead and an output lead, and said difference circuit responsive to the oscillator signal on the difference circuit first input lead and a reference signal on the difference circuit second input lead to generate a difference signal at the difference circuit output lead, and the difference signal corresponding to an accumulation of phase differences of the reference signal and the oscillator signal; and a sample circuit comprising a first input lead coupled to the output lead of the difference circuit, an output lead coupled to the input lead of the oscillator, and a second input lead responsive to a timing signal repeatedly generated during a continuous accumulation of the phase differences to sample the difference signal on the first input lead of the sample circuit and generate the tuning signal on the sample circuit output lead.

16. The phase locked loop of claim 15, wherein said difference circuit further comprises:
   a) a phase comparator comprising first and second input leads coupled to the first and second input leads of the difference circuit and an output lead, and responsive to the oscillator signal on the difference circuit first input lead and the reference signal on the difference circuit second input lead to generate a phase signal at said phase comparator output lead, such that the phase signal corresponds to phase differences of the reference signal and the oscillator signal; and
   b) an integrator comprising an input lead coupled to the output lead of the phase comparator and an output lead coupled to the output lead of the difference circuit and responsive to the phase signal at the integrator input lead to cumulatively integrate the phase signal and to generate the difference signal at the difference circuit output lead.

17. The phase locked loop of claim 16, wherein said sample circuit further comprises:
   a) a null detect circuit comprising an input lead coupled to the output lead of the phase comparator and an output lead, responsive to a null in the phase signal on the null detect circuit input lead to generate the timing signal at the output lead of the null detect circuit.

18. The phase locked loop of claim 15, wherein said sample circuit further comprises:
   an antisaturation circuit comprising an input lead coupled to the first input lead of the sample circuit and an output lead coupled to the second input lead of the sample circuit, and responsive to a threshold condition on the difference signal on the input of the antisaturation circuit to generate a lock signal on the output of the antisaturation circuit; and
   said sample circuit is responsive to at least one of the timing signal and the lock signal on the sample circuit second input lead, to sample the difference signal on the first input lead of the sample circuit and generate the tuning signal on the sample circuit output lead.

19. A method for operating a frequency synthesizer, comprising:
   generating an oscillator signal having a frequency corresponding to a tuning signal;
   dividing the oscillator signal by a division factor to generate a reduced frequency signal;
   combining a reference signal and the reduced frequency signal to generate a difference signal proportional to an accumulation of phase differences between the reference signal and the reduced frequency signal; and
   sampling the difference signal in response to a timing signal repeatedly generated during a continuous accumulation of the phase differences to produce the tuning signal.

20. The method of claim 19, wherein the step of combining further comprises:
   a) detecting phase differences between the reference signal and the reduced frequency signal to generate a phase signal; and
   b) cumulatively integrating the phase signal to produce the difference signal.

21. The method of claim 20, wherein the step of sampling further comprises:
   a) detecting a null in the phase signal to generate the timing signal.

22. The method of claim 19, wherein the step of sampling further comprises:
   a) detecting a threshold condition on the difference signal, and generating a lock signal; and
   b) sampling the difference signal in response to at least one of the timing signal and the lock signal to generate the tuning signal.

23. The method of claim 20, wherein:
   the step of dividing further comprises;
   a) generating a cyclic signal corresponding to the cyclic alteration of at least two division factors; and
   b) dividing the oscillator signal by each of at least two division factors in response to the cyclic signal to generate the reduced frequency signal, such that the reduced frequency signal is a non-integer fraction of the oscillator signal; and
   the step of sampling further comprises;
   a) detecting the cyclic signal and the phase signal to generate the timing signal.

24. A method for operating a phase locked loop, comprising:
   generating an oscillator signal having a frequency corresponding to a tuning signal;
   combining a reference signal and the oscillator signal to generate a difference signal proportional to an accumulation of phase differences between the reference signal and the oscillator signal; and
   sampling the difference signal in response to a timing signal repeatedly generated during a continuous accumulation of the phase differences to produce the tuning signal.

25. The method of claim 24, wherein the step of combining further comprises:
   detecting phase differences between the reference signal and the oscillator signal to generate a phase signal; and
   cumulatively integrating the phase signal to produce the difference signal.

26. The method of claim 25, wherein the step of sampling further comprises:
   detecting a null in the phase signal to generate the timing signal.

27. The method of claim 24, wherein the step of sampling further comprises:
   detecting a threshold condition on the difference signal, and producing a lock signal; and
   sampling the difference signal in response to at least one of the timing signal and the lock signal to generate the tuning signal.

28. A difference circuit, comprising:
- a phase comparator to receive a first signal and a second signal to produce a phase difference signal corresponding to phase differences of the first and the second signal; and
- an integrator to continuously receive and integrate the phase difference signal to produce a difference signal corresponding to an accumulation of the phase differences of the first and the second signal;
- a sample circuit which samples the difference signal in response to a timing signal, and the timing signal repeatedly generated during a continuous accumulation of the phase differences; and
- a hold circuit to hold the sampled difference signal and produce a tuning signal, corresponding to the sampled difference signal.

29. The difference circuit of claim 28, wherein said timing signal corresponds to a null in said phase difference signal.

30. The difference circuit of claim 28, further comprising;
- an oscillator for producing the first signal having a frequency varying in response to the tuning signal.

31. A method for operating a difference circuit, comprising:
- combining a first signal and a second signal to generate a phase difference signal corresponding to phase differences of the first and the second signal; and
- integrating the phase difference signal to produce a difference signal corresponding to an accumulation of the phase differences of the first and the second signal;
- sampling the difference signal in response to a timing signal, and the timing signal repeatedly generated during a continuous accumulation of the phase differences; and
- holding the sampled difference signal; and generating a tuning signal, corresponding to the sampled difference signal.

32. The method of claim 31 wherein the step of sampling further comprises:
- a) detecting a null in the phase difference signal to generate the timing signal.

33. The method of claim 31, further comprising:
- generating the second signal having a frequency corresponding to the tuning signal.

34. A frequency synthesizer, comprising:
- an oscillator for producing a variable frequency oscillator signal in response to a tuning signal;
- a divider circuit which divides by a division factor and said divider circuit communicating with a reference signal source to receive a reference signal and to divide the reference signal by the division factor to produce a reduced frequency signal;
- a difference circuit to receive said variable frequency oscillator signal and to communicate with said divider circuit to receive said reduced frequency signal to produce a difference signal corresponding to an accumulation of phase differences of the variable frequency oscillator signal and the reduced frequency signal; and
- a sample circuit which samples the difference signal in response to a timing signal repeatedly generated during a continuous accumulation of the phase differences to produce the tuning signal.

35. The frequency synthesizer of claim 34, wherein said difference circuit further comprises:
- a phase comparator to receive the variable frequency oscillator signal and the reduced frequency signal to produce a phase signal corresponding to phase differences of the variable frequency oscillator signal and the reduced frequency signal; and
- an integrator to receive and cumulatively integrate the phase signal to produce the difference signal.

36. The frequency synthesizer of claim 35, wherein said sample circuit further comprises:
- a null detect circuit to receive the phase signal, to detect a null in the phase signal and to produce the timing signal.

37. The frequency synthesizer of claim 34, wherein said sample circuit further comprises:
- an antisaturation circuit to receive the difference signal, to detect a threshold condition on said difference signal, and to produce a lock signal; and
- said sample circuit samples the difference signal in response to at least one of the timing signal and the lock signal to produce the tuning signal.

38. The frequency synthesizer of claim 34, wherein:
- said divider circuit further comprises;
  - a) a fractional control to provide a cycle signal corresponding to a changeover between at least two division factors;
  - b) a fractional divider to divide said reference signal by each of the at least two division factors in response to the cycle signal to produce the reduced frequency signal which is a non-integer fraction of said reference signal.

39. A method for operating a frequency synthesizer, comprising:
- generating an oscillator signal having a frequency corresponding to a tuning signal;
- dividing a reference signal by a division factor to generate a reduced frequency signal;
- combining the oscillator signal and the reduced frequency signal to generate a difference signal proportional to an accumulation of phase differences between the oscillator signal and the reduced frequency signal; and
- sampling the difference signal in response to a timing signal repeatedly generated during a continuous accumulation of the phase differences to produce the tuning signal.

40. The method of claim 39, wherein the step of combining further comprises:
- a) detecting phase differences between the oscillator signal and the reduced frequency signal to generate a phase signal; and
- b) cumulatively integrating the phase signal to produce the difference signal.

41. The method of claim 40, wherein the step of sampling further comprises:
- a) detecting a null in the phase signal to generate the timing signal.

42. The method of claim 39, wherein the step of sampling further comprises:
- a) detecting a threshold condition on the difference signal, and generating a lock signal; and
- b) sampling the difference signal in response to at least one of the timing signal and the lock signal to generate the tuning signal.

43. The method of claim 39, wherein:
- the step of dividing further comprises;
  - a) generating a cyclic signal corresponding to the cyclic alteration of at least two division factors; and b) dividing the reference signal by at least two division factors responsive to the cyclic signal to generate the reduced frequency signal, such that the reduced frequency signal is a non-integer fraction of the reference signal; and the step of sampling further comprises;
a) detecting the difference signal and the cyclic signal to generate the timing signal.

44. A frequency synthesizer, comprising:

an oscillator for producing a variable frequency oscillator signal in response to a tuning signal;

a divider circuit which divides by a division factor and communicating with said oscillator to receive and divide said variable frequency oscillator signal by the division factor to produce a reduced frequency signal;

a difference circuit to receive a reference signal and said reduced frequency signal to produce a difference signal corresponding to a phase difference of the reference signal and the reduced frequency signal; and a sample circuit including an antisaturation circuit, and the antisaturation circuit to receive the difference signal, to detect a threshold condition on the difference signal, and to produce a lock signal, and said sample circuit sampling the difference signal in response to at least one of a timing signal and the lock signal to produce the tuning signal.

45. A phase locked loop, comprising:

an oscillator for producing a variable frequency oscillator signal in response to a tuning signal;

a difference circuit to receive a reference signal and said variable frequency oscillator signal to produce a difference signal corresponding to a cumulation of phase differences of the reference signal and the variable frequency oscillator signal; and a sample circuit including an antisaturation circuit, and the antisaturation circuit to receive the difference signal, to detect a threshold condition on said difference signal, and to produce a lock signal, and said sample circuit to sample the difference signal in response to at least one of a timing signal and the lock signal to produce the tuning signal.

46. A frequency synthesizer, comprising:

an oscillator comprising an input lead and an output lead, responsive to a tuning signal on said input lead to vary the frequency of an oscillator signal at the output lead;

a divider comprising an input lead coupled to the output lead of the oscillator and an output lead, responsive to the oscillator signal at the divider input lead to generate a reduced frequency signal at the divider output lead;

a difference circuit comprising a first input lead coupled to the output lead of the divider, a second input lead and an output lead, and said difference circuit responsive to the reduced frequency signal on the difference circuit first input lead and a reference signal on the difference circuit second input lead to generate a difference signal at the difference circuit output lead, and the difference signal corresponding to a cumulation of phase differences of the reference signal and the reduced frequency signal; and a sample circuit including an antisaturation circuit, and the sample circuit comprising a first input lead and a second input lead, the first input lead being coupled to the output lead of the difference circuit, an output lead coupled to the input lead of the oscillator, and the antisaturation circuit comprising an input lead coupled to the first input lead of the sample circuit and an output lead coupled to the second input lead of the sample circuit, and responsive to a threshold condition on the difference signal on the input of the antisaturation circuit to generate a lock signal on the output of the antisaturation circuit, and the sample circuit responsive to at least one of a timing signal and the lock signal on the sample circuit second input lead, to sample the difference signal on the first input lead of the sample circuit and generate the tuning signal on the sample circuit output lead.

47. A method for operating a frequency synthesizer, comprising:

generating an oscillator signal having a frequency corresponding to a tuning signal;

dividing the oscillator signal by a division factor to generate a reduced frequency signal;

combining a reference signal and the reduced frequency signal to generate a difference signal proportional to a cumulation of phase differences between the reference signal and the reduced frequency signal;

detecting a threshold condition on the difference signal, and generating a lock signal; and sampling the difference signal in response to at least one of a timing signal and the lock signal to generate the tuning signal.

48. A method for operating a phase locked loop, comprising:

generating an oscillator signal having a frequency corresponding to a tuning signal;

combining a reference signal and the oscillator signal to generate a difference signal proportional to a cumulation of phase differences between the reference signal and the oscillator signal;

detecting a threshold condition on the difference signal, and producing a lock signal; and sampling the difference signal in response to at least one of a timing signal and the lock signal to generate the tuning signal.

49. A frequency synthesizer, comprising:

an oscillator for producing a variable frequency oscillator signal in response to a tuning signal;

a divider circuit which divides by a division factor and said divider circuit communicating with a reference signal source to receive a reference signal and to divide the reference signal by the division factor to produce a reduced frequency signal;

a difference circuit to receive said variable frequency oscillator signal and to communicate with said divider circuit to receive said reduced frequency signal to produce a difference signal corresponding to a cumulation of phase differences of the variable frequency oscillator signal and the reduced frequency signal; and a sample circuit which includes an antisaturation circuit, and the antisaturation circuit to receive the difference signal, to detect a threshold condition on said difference signal, and to produce a lock signal, and the sample circuit to sample the difference signal in response to at least one of a timing signal and the lock signal to produce the tuning signal.

50. A method for operating a frequency synthesizer, comprising:

generating an oscillator signal having a frequency corresponding to a tuning signal;

dividing a reference signal by a division factor to generate a reduced frequency signal;

combining the oscillator signal and the reduced frequency signal to generate a difference signal proportional to a cumulation of phase differences between the oscillator signal and the reduced frequency signal;

detecting a threshold condition on the difference signal, and generating a lock signal; and sampling the difference signal in response to at least one of a timing signal and the lock signal to generate the tuning signal.

51. A phase locked loop, comprising:

an oscillator comprising an input lead and an output lead, responsive to a tuning signal on said input lead to vary the frequency of an oscillator signal at the output lead;

a difference circuit comprising a first input lead coupled to the output lead of the oscillator, a second input lead and an output lead, and said difference circuit responsive to the oscillator signal on the difference circuit first input lead and a reference signal on the difference circuit second input lead to generate a difference signal at the difference circuit output lead, and the difference signal corresponding to an accumulation of phase differences of the reference signal and the oscillator signal;

a sample circuit comprising a first input lead coupled to the output lead of the difference circuit, an output lead coupled to the input lead of the oscillator, and a second input lead responsive to a timing signal repeatedly generated during a continuous accumulation of the phase differences to sample the difference signal on the first input lead of the sample circuit and generate the tuning signal on the sample circuit output lead; and wherein said sample circuit further comprises:

an antisaturation circuit comprising an input lead coupled to the first input lead of the sample circuit and an output lead coupled to the second input lead of the sample circuit, and responsive to a threshold condition on the difference signal on the input of the antisaturation circuit to generate a lock signal on the output of the antisaturation circuit; and said sample circuit second input lead is responsive to at least one of the timing signal and the lock signal on the sample circuit second input lead, to sample the difference signal on the first input lead of the sample circuit and generate the tuning signal on the sample circuit output lead.

* * * * *